4/26/83

United States Patent [19]
Filler et al.

[11] 4,381,471
[45] Apr. 26, 1983

[54] SC-CUT QUARTZ RESONATORS WITH SUPPRESSED B-MODE

[75] Inventors: Raymond L. Filler, Freehold; John R. Vig, Colts Neck, both of N.J.

[73] Assignee: The United States of America as represented by the Secretary of the Army, Washington, D.C.

[21] Appl. No.: 246,519

[22] Filed: Mar. 23, 1981

[51] Int. Cl.³ .............................................. H01L 41/08
[52] U.S. Cl. ................................... 310/353; 310/361; 310/369; 310/312
[58] Field of Search ............... 310/360, 361, 346, 369, 310/351, 353, 312

[56] References Cited

U.S. PATENT DOCUMENTS

| 3,069,572 | 12/1962 | Dick et al. | 310/361 X |
| 4,070,502 | 1/1978 | Vig et al. | 310/361 X |
| 4,135,108 | 1/1979 | Besson | 310/361 X |

*Primary Examiner*—Mark O. Budd
*Attorney, Agent, or Firm*—Nathan Edelberg; Jeremiah G. Murray; Edward Goldberg

[57] ABSTRACT

Disc shaped quartz crystal resonators of plano-convex, plano-plano, and biconvex configurations have the b-mode resistance raised relative to the c-mode resistance by the proper choice of mounting geometry, thus suppressing the undesired b-mode in precision oscillator circuits without the use of added circuitry.

8 Claims, 7 Drawing Figures

SC-CUT QUARTZ RESONATORS WITH SUPPRESSED B-MODE

The invention described herein may be used by and for the Government without the payment of royalties.

BACKGROUND OF THE INVENTION

The field of this invention is quartz crystal resonators, which resonators are useful as the frequency determining elements in such circuits as oscillators and filters. More particularly, the invention for the first time makes it practical to utilize SC-cut resonators vibrating in their fundamental modes in standard high precision crystal oscillators. The invention thus expands the utility of SC-cut resonators with all of their attendant advantages, and overcomes some of the disadvantages of this cut which have hitherto limited the use of these resonators. The invention provides a high Q resonator of this type which inherently suppresses the undesired b-mode of vibration without the addition of circuitry to the oscillator.

SUMMARY OF THE INVENTION

The invention is based on the discovery that for fundamental mode SC-cut resonators the ratio of $R_b$ to $R_c$, that is, the ratio of the resonator resistance in the b or undesired mode, to the c or desired mode can be significantly increased by proper location of the resonator blank mounting clips relative to the crystalographic axes. More particularly, the location of such mounting clips at diametrically opposed points on the circular resonator blank along the ZZ' axis thereof will produce the aforementioned increase in $R_b$, which leads to suppression of the undesired mode of vibration. Also it has been found that a fundamental mode plano-convex SC-cut crystal will have a Q suitable for high precision applications if the convex face thereof has a contour in the region of 1.0 to 3.0 diopters, inclusive.

It is thus an object of this invention to provide an SC-cut crystal resonator blank with such a contour and mounting geometry that it will be suitable for use in a high precision oscillator circuit in which said resonator operates in its fundamental c-mode, and wherein the undesired b-mode is suppressed.

Another object of the invention is to raise the resistance, $R_b$, of the fundamental b-mode of an SC-cut quartz resonator relative to the resistance, $R_c$, of the fundamental c-mode thereof by the proper choice of its mounting geometry.

A still further object of the invention is to provide a high Q SC-cut quartz resonator which has a b-mode resistance higher than its c-mode resistance.

These and other objects and advantages will become apparent from the following detailed description and the drawings.

DETAILED DESCRIPTION OF A PREFERRED EMBODIMENT

In the past quartz crystal resonators vibrating in overtone modes have been usually employed in crystal oscillators where the highest possible stability was required. However, fundamental mode resonators can be used for many of these high precision applications. The doubly rotated SC-cut crystal with its well known advantages of no thermal transient effect or other stress related frequency errors would be ideal for such fundamental mode, high precision oscillators. These stress compensated (SC) cut crystals have had the disadvantage, prior to the present invention, of having an undesired b-mode of vibration which is about 10% higher in frequency than the desired c-mode, with the b-mode resistance often comparable to or lower than the c-mode resistance. In prior art oscillators using fundamental mode SC-cut resonators, external circuit means such as "traps" tuned to the undesired b-mode frequency have had to be used, since the oscillator could start up and run in its b-mode if the b-mode resistance, $R_b$, happened to be the same or less than the c-mode resistance, $R_c$, which was often the case. The extra circuitry needed to suppress the b-mode is undesirable because it results in higher costs, and because it involves the use of inductors which increases the size and can degrade the stability of the oscillator.

It is known that in the c-mode the particle displacement in the resonator is along the XX' crystallographic axis of the mother crystal and substantially along the ZZ' axis for the b-mode. Thus these motions are approximately perpendicular to each other for these modes. It has been found that locating the mounting clips or points at diametrically opposed points on the plano-convex resonator disc, along the ZZ' axis thereof raises the b-mode resistance substantially, relative to the c-mode resistance. Since crystal oscillators will operate at the mode of least resistance, spurious b-mode operation will be eliminated without the use of external circuitry such as the tuned traps mentioned above. The increase in b-mode resistance is probably due to the damping effect of ZZ' axis motion by the mounting clip geometry.

Figure 1:
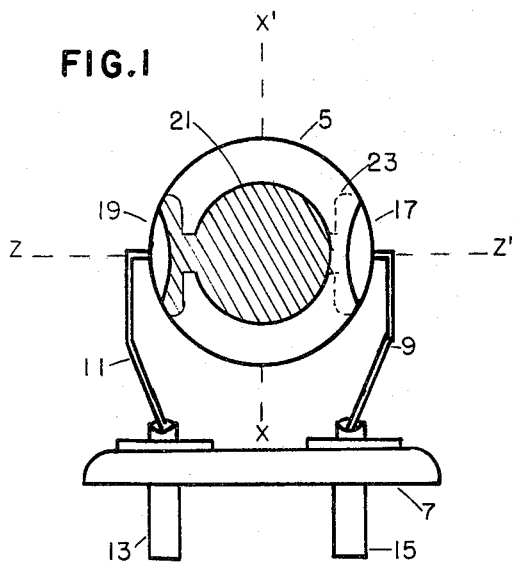
FIG. 1 shows a resonator blank mounted in accordance with the present invention.

FIG. 1 shows an SC-cut plano-convex resonator blank 5, mounted in a standard mounting device known as the HC-36/U header. This header comprises a base 7 with contact pins 13 and 15 projecting from the bottom thereof. The mounting clip comprises a pair of stainless steel arms 9 and 11 which connect with the right and left pins. The arms terminate in contacts 17 and 19 which are bonded to the resonator blank at opposite sides thereof, along the ZZ' axis, as shown. The bonding agent used was a silver filled polymide adhesive. The left contact 19 makes connection to the front electrode 21, which is gold. The similar rear electrode 23 connects to the right hand contact 17. After the resonator is so mounted a hermetic seal is cold-welded to the base 7, with the interior thereof evacuated to a pressure of $10^{-7}$ torr.

Figure 2:
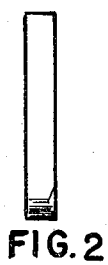
FIGS. 2-4 show side views of plano-plano, plano-convex, and biconvex resonator blanks, respectively.
Figure 3:
Figure 4:
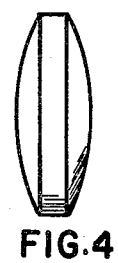

FIG. 2 is a side view of a disc type resonator blank showing the two planar broad sides thereof. FIG. 3 is a similar view of a plano-convex resonator showing that one broad side is planar and the other convex. FIG. 4 is a biconvex resonator with two convex broad sides. All of these three resonators are circular when viewed in elevation, as in FIG. 1.

Figure 5:
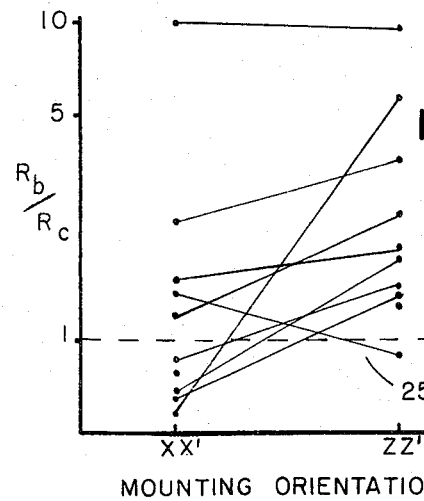
FIGS. 5-7 are graphs of test results showing the performance of resonators resulting from the present invention.

In order to verify the assumption that the mounting orientation has a significant effect on b-mode resistance, a group of ten plano-convex resonator blanks were mounted along their ZZ' axes, as shown in FIG. 1, and then re-mounted along their XX' axes, and the values of b and c-mode resistances measured at both orientations. The results of this experiment are shown in FIG. 5, wherein the ratio $R_b$ to $R_c$ is plotted as a function of mounting orientation. The vertical array of points above the abscissa marked XX' shows that five of the ten resonators had the ratio $R_b/R_c$ less than unity. Thus 50% of this group had a b-mode resistance less than c-mode resistance, which would make these resonators unsuitable for use in precision applications. The array of points above abscissa ZZ' shows that 9 out of 10 of these same resonators now have a higher b-mode resistance than c-mode resistance. The solid lines in this figure connect points representing the same resonator. It can be seen that all five of the resonators which had $R_b/R_c$ less than one at XX' have increased this figure to greater than unity at ZZ' orientation. In one case, labelled 25, the ratio was worse at ZZ' than at XX'. This anomaly could be the result of faulty measurement. In any event a resonator which exhibited such a resistance ratio at ZZ' orientation would in practice be either discarded or used for another suitable purpose.

Figure 6:
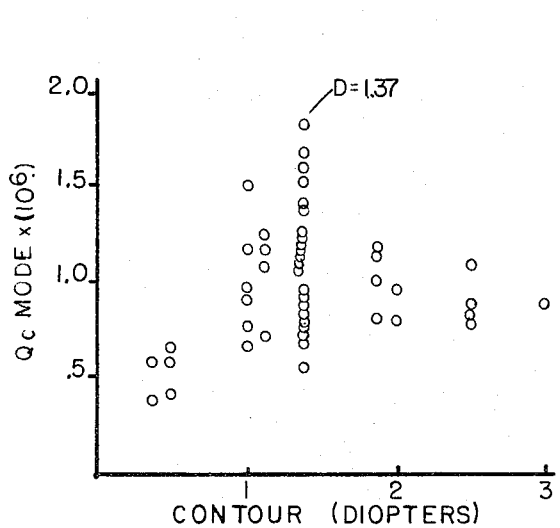

The next experiment involved measuring the c-mode Q of 50 resonators of this type with different contours of the convex surface, mounted as shown in FIG. 1. The diopter values ranged from 0.62 to 3.0. The diopter value, D, is a measure of the curvature of the convex side of a resonator blank and is defined as the reciprocal of the radius of curvature in meters. The Q of a resonator is a measure of the quality thereof analogous to the same term used in tuned circuits. FIG. 6 shows that the maximum Q of approximately $1.8 \times 10^6$ occurs at 1.37 diopters. The average Q of the approximately 25 resonators with D=1.37 was $1.0 \times 10^6$, which is adequate for most high precision oscillator applications. However FIG. 6 shows that all of the resonators having diopter values between 1.0 and 3.0 had Qs in excess of $0.5 \times 10^6$, which is acceptable for many high precision applications.

Figure 7:
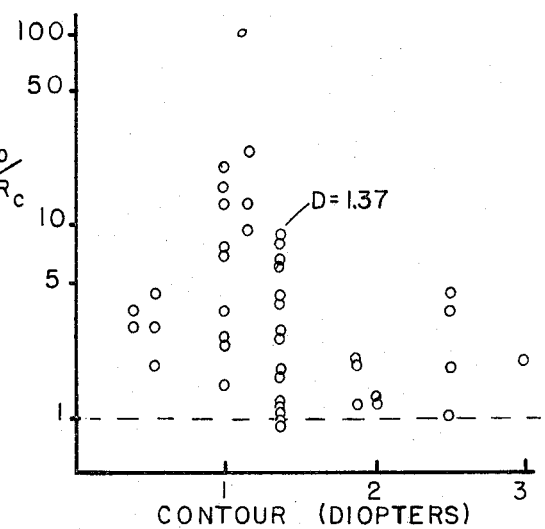

Next the ratio $R_b$ to $R_c$ was measured for the same 50 resonators, similarly mounted. These results are plotted in FIG. 7. It can be seen that only one of these resonators has an unacceptable ratio of $R_b$ to $R_c$. This small percentage of unacceptability is not a great disadvantage and such units can be rejected by a quality control system with small loss.

The suppression of the b-mode has also been observed on plano-plano resonators, when mounted along the ZZ' axis in accordance with the present invention. A group of 45 such SC-cut resonators showed $R_b$ greater than $R_c$ for fundamental mode operation in 42 cases.

The foregoing tests of Q vs. contour show that while a value of D=1.37 represents the center of an acceptable range and is thus preferred as the contour for high precision applications, most resonators mounted along the ZZ' axis and having any contour between 1.0 and 3.0 diopter, inclusive would prove acceptable.

Tests of the capacitance ratio $C_0/C_1$, for approximately 25 of these SC-cut resonators with various contours showed that this ratio varied from 1000 at D=0.37 to 1700 at D=2.5, in a linear fashion. These values of $C_0/C_1$ are large compared to those of singly rotated crystal cuts such as the AT. A large $C_0/C_1$ means that the crystal oscillator is more difficult to pull in frequency due to changes in external circuit parameters, thus resulting in a more stable oscillator.

While the invention has been described in connection with illustrative embodiments, variations therein will occur to those skilled in this art without departing from the novel concepts disclosed herein, accordingly, the invention should be limited only by the scope of the appended claims. For example, the method can be expected to work for fundamental mode biconvex SC-cut resonators as well.

We claim:

1. An SC-cut quartz crystal resonator blank adapted to oscillate in its desired fundamental c-mode, comprising: a disc shaped blank of an SC-cut crystal resonator, a pair of mounting clips contacting said blank at diametrically opposed points on the edges of said blank, with said blank oriented so that the ZZ' crystallographic axis thereof passes through both of said diametrically opposed points, the position of the mounting clips increasing the b-mode resonator resistance with respect to the c-mode resistance to a ratio greater than unity to suppress undesired b-mode oscillation.

2. The resonator blank of claim 1 wherein said blank is plano-convex and the contour of the convex side thereof is in the range of 1.0 to 3.0 diopters, inclusive.

3. The resonator of claim 1 wherein said blank is a disc with plano-plano sides.

4. The resonator of claim 1 wherein said blank has biconvex sides.

5. The resonator blank of claim 2 wherein the contour of the convex side thereof is 1.37 diopters.

6. A high Q quartz crystal resonator of generally disc shape adapted to oscillate in its desired fundamental c-mode with undesired mode-b oscillation inherently suppressed, comprising: an SC-cut crystal resonator blank having a mounting which increases the b-mode resonator resistance $R_b$ with respect to the c-mode resistance $R_c$, the ratio of $R_b$ to $R_c$ being greater than unity, including a pair of mounting clips contacting diametrically opposed points on the edges of said blank along the ZZ' crystallographic axis thereof.

7. The crystal resonator of claim 6 wherein said blank is plano-convex in shape with a diopter value of 1.37.

8. The crystal resonator of claim 6 wherein said blank includes at least one convex side having a contour in the range of 1.0 to 3.0 diopters.

* * * * *